United States Patent [19]

Glaski

[11] 4,138,512
[45] Feb. 6, 1979

[54] PROCESS FOR CHEMICAL VAPOR DEPOSITION OF A HOMOGENEOUS ALLOY OF REFRACTORY METALS

[75] Inventor: Fred A. Glaski, Chatsworth, Calif.

[73] Assignee: The United States of America as represented by the Secretary of the Army, Washington, D.C.

[21] Appl. No.: 842,811

[22] Filed: Oct. 17, 1977

[51] Int. Cl.² ............................................. B05D 7/22
[52] U.S. Cl. ............................. 427/237; 427/248 A; 427/248 B; 427/253
[58] Field of Search .............. 427/237, 248 R, 248 A, 427/248 B, 250, 253

[56] References Cited

U.S. PATENT DOCUMENTS

| | | | |
|---|---|---|---|
| 1,226,925 | 5/1917 | Thowless | 427/253 |
| 2,815,299 | 12/1957 | Raymond | 427/237 |
| 2,885,310 | 5/1959 | Olson et al. | 427/253 |
| 3,188,230 | 6/1965 | Bakish et al. | 427/250 |
| 3,268,362 | 8/1966 | Hanak et al. | 427/62 |
| 3,781,173 | 12/1973 | Napier et al. | 427/237 |

FOREIGN PATENT DOCUMENTS

| | | | |
|---|---|---|---|
| 468796 | 10/1950 | Canada | 427/253 |
| 1527560 | 5/1968 | France | 427/253 |
| 577504 | 5/1946 | United Kingdom | 427/253 |

OTHER PUBLICATIONS

Metal Finishing, vol. 50, No. 4, "The Formation of Metallic Coatings by Vapor-Phase Techniques", Powell et al., pp. 64–69, Apr. 1952.

Doo et al., IBM Technical Disclosure Bulletin, "Process for Molybdenum Vapor Deposition", vol. 13, No. 2, Jul. 1970.

Primary Examiner—Ronald H. Smith
Assistant Examiner—Sadie L. Childs
Attorney, Agent, or Firm—Nathan Edelberg; Harold H. Card, Jr.; A. Victor Erkkila

[57] ABSTRACT

A coating of refractory metals alloy, e.g. an alloy of tantalum and tungsten, is deposited on a substrate, such as the bore of a gun barrel, by reacting an alloy of the refractory metals with chlorine to form a mixture of the vapors of the refractory metal chlorides and reacting the resulting mixture of vapors with hydrogen to reduce the metal chlorides to the free metals. The alloy coating thus deposited possesses a finer grain structure and is more homogeneous and ductile than one obtained by chlorinating the tantalum and tungsten metals separately.

3 Claims, 3 Drawing Figures

400X

TA-8.5%W DEPOSITED FROM CHLORINATED TA-10W ALLOY

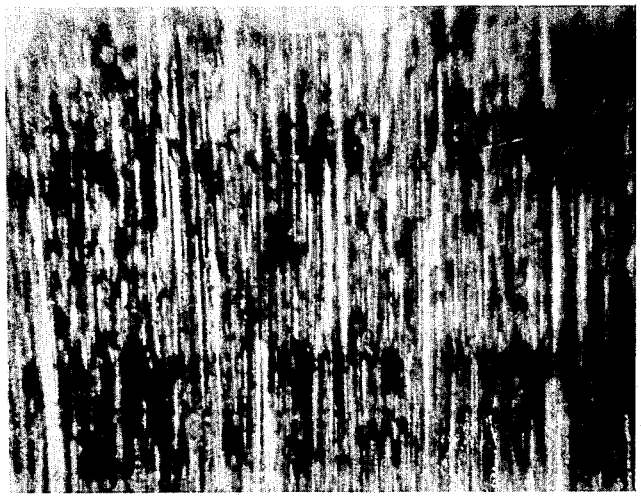
FIGURE 2      TA-8.5%W  DEPOSITED FROM  CHLORINATED TA-10W ALLOY
FIGURE 3     TA-10W DEPOSITED FROM SEPARATELY CHLORINATED TA-W

PROCESS FOR CHEMICAL VAPOR DEPOSITION OF A HOMOGENEOUS ALLOY OF REFRACTORY METALS

GOVERNMENTAL INTEREST

The invention described herein was made in the course of a contract with the Government and may be manufactured, used and licensed by or for the Government for governmental purposes without the payment to me of any royalty thereon.

BACKGROUND OF THE INVENTION

The present invention relates to the production of refractory metal alloy coatings on substrates by the chemical vapor deposition (CVD) technique. The invention is particularly directed to the production of such alloy coatings on gun bores.

Gun bores erosion is a serious problem. During the firing of a large number of ammunition rounds, combustion of the predominantly nitrocellulose propellants produces end products of a reducing nature. The high temperatures and pressures encountered during firing procedures cause deterioration of the substrate and erosion of the gun barrel. As a result of the material erosion in the bore, propellant combustion gases escape between the projectile and the bore surface. The gas blowby further increases projectile and barrel erosion and transports eroded particles along the bore where they are redeposited. This action can result in a decrease in projectile muzzle velocity, reduction in firing accuracy and reduction in the effective range of the gun.

Chromium electrolytic plating is at present the most economical method of providing a wear resistant and thermal barrier against the severe conditions encountered in the gun tube. However, the porosity and inherent crack network found in the chrome plate often leads to shearing and flaking in the early rounds of firing, and a progressive softening of the plate occurs with continued firing, thereby decreasing the wear resistance of the plate.

Refractory metals and alloys have been studied as materials for increasing gun tube service life relative to chromium plated steel. Co-extruded gun tubes with tantalum-tungsten liners have been successful in this regard. However, the high cost of the co-extrusion process has stimulated a search for more economical coating methods to provide such refractory alloy surfaces on gun bores.

Since a tantalum-tungsten alloy cannot be suitably plated by conventional methods, the chemical vapor deposition method has been found to be suitable. In the past, conventional chemical vapor deposition practice has utilized metal halides, produced from separate sources and subsequently mixed, for depositing refractory metal alloys. For example, tantalum metal was reacted directly with chlorine gas to form $TaCl_5$. Similarly, tungsten metal was reacted directly with chlorine gas to form $WCl_6$. The $TaCl_5$ and $WCl_6$ were then mixed with hydrogen and resulting mixture was passed over the heated article to be coated, whereby deposition of Ta-W alloy took place. Ternary alloys were also deposited in similar manner.

SUMMARY OF THE INVENTION

An object of the present invention is to provide a simplified CVD process for plating a refractory metal alloy on a substrate.

Another object of the invention is to provide an improvement in the CVD process for coating a substrate, such as a steel gun barrel bore, with an alloy of refractory metals, whereby a coating having superior grain structure, homogeniety and ductility is obtained.

Other objects will become apparent as the invention is further described.

It has been found that the foregoing objects can be achieved according to the present invention by an improvement in the CVD process for plating an alloy consisting essentially of refractory metals selected from the group consisting of tantalum, tungsten, molybdenum and niobium, on a substrate. The improvement comprises reacting an alloy of the refractory metals with chlorine to form a mixture of vapors of the refractory metal chlorides, and reacting the resulting mixture of vapors with hydrogen to reduce the metal chlorides to the free metals.

The process of the present invention is unobvious, since deposits obtained by chlorinating an alloy of the refractive metals according to the present process unexpectedly have been found to exhibit a much finer and more uniform grain structure possessing a lower microhardness and better ductility and adhesion to the substrate than deposits produced by chlorinating the metals separately and then mixing and reducing the mixed metal chlorides with hydrogen, as in the prior art.

BRIEF DESCRIPTION OF THE DRAWINGS

FIG. 2 is a photomicrograph of the microstructure of a Ta-W alloy obtained according to the process of the present invention.

FIG. 3 is a photomicrograph of the microstructure of a Ta-W alloy obtained from separately chlorinated Ta and W according to the prior art.

DETAILED DESCRIPTION OF THE INVENTION

Apparatus

Figure 1:
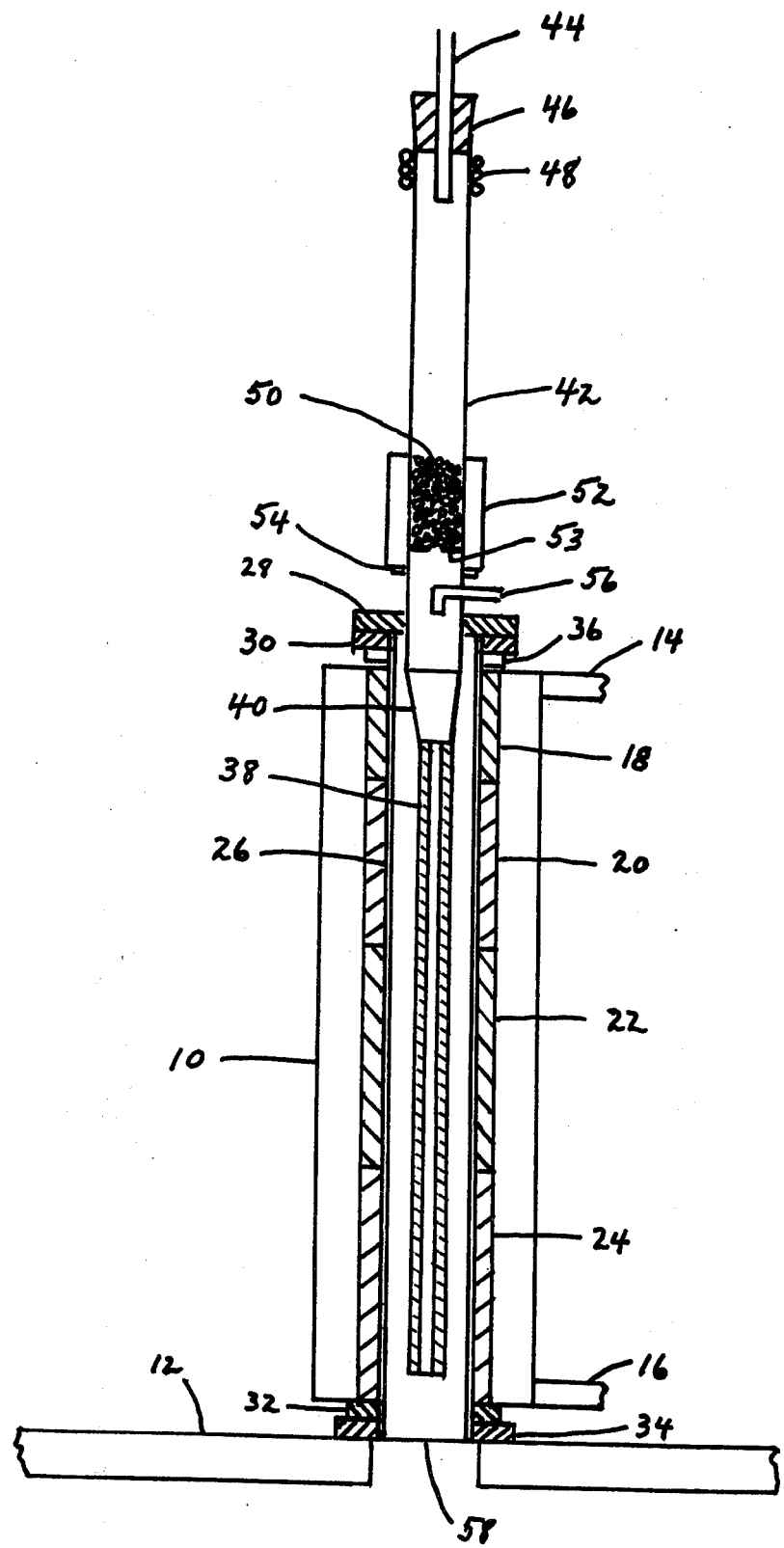
FIG. 1 illustrates a longitudinal cross-sectional diagram of apparatus suitable for vapor deposition of refractory metal alloys by the process of the present invention on the interior surface of gun barrel bores as well as on the exterior surface of metal rods.

As shown in the drawing, the apparatus consisted of a fire brick insulated, split half resistance furnace 10 standing on a support table 12 and provided with two carbon steel supports 14, 16. The furnace contained four separately controlled nichrome resistance heaters of the clamshell type 18, 20, 22, 24 (to permit the rapid simultaneous removal of all four heaters from the retort tube at the conclusion of the deposition run), which surrounded the entire length of an Inconel 600 retort tube 26, 1.5 in (3.8 cm) ID and 28 in (71.1 cm) long. The retort tube was flanged at both ends with top plate flanges of carbon steel 28, 30 and bottom plate flanges of 304 stainless steel 32, 34 and contained a retort cooling copper water channel 36 located below top flange 30. The gun barrel or rod specimen 38 was held in the retort tube by means of a specimen holder 40.

A carbon steel tube 42 for effecting the chlorination and reduction reactions was mounted in the top flange 28 of the retort tube. The upper end of the tube 42 contained a chlorine inlet tube 44 and a rubber seal 46, below which copper cooling coils 48 were mounted. A lower section of the tube contained a bed of refractory metal alloy chips 50, which was supported by an annular rim 53 and surrounded by a resistance heater 52 with a carbon steel support 54. A hydrogen inlet tube of copper 56 was located below the bed of metal alloy chips.

Depositions on the Exterior Surface of Molybdenum Rods

Ta-W alloys were deposited on the exterior surfaces of solid molybdenum rods in the foregoing apparatus as follows:

A stream of chlorine gas was passed through a heated bed of Ta-10W alloy chips 50 consisting of 90% tantalum and 10% tungsten. The resulting gaseous mixture of Ta and W chlorides was mixed with a stream of hydrogen gas from inlet tube 56 and the total gas mixture was passed through the retort tube 26 through positive containment measures, wherein deposition of the Ta-W alloy was effected on the exterior surface of the heated molybdenum rod. The residual gases flowed from the exhaust end 58 of the retort tube 26 into the vacuum system below said tube (not shown).

The basic chemical reactions involved in the chlorination and deposition steps are the following:

Chlorination:

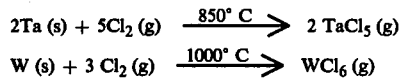

$$2Ta(s) + 5Cl_2(g) \xrightarrow{850°\,C} 2\,TaCl_5(g)$$

$$W(s) + 3Cl_2(g) \xrightarrow{1000°\,C} WCl_6(g)$$

Deposition:

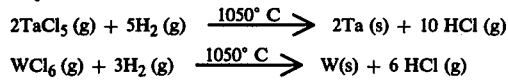

$$2TaCl_5(g) + 5H_2(g) \xrightarrow{1050°\,C} 2Ta(s) + 10\,HCl(g)$$

$$WCl_6(g) + 3H_2(g) \xrightarrow{1050°\,C} W(s) + 6\,HCl(g)$$

Table 1 summarizes the experimental conditions and results. Depositions conducted at 1200° C., 1100° C., and 1000° C. produced corresponding decreases in tungsten content of the deposit from 9% to 3% by weight, all depositions taking place at 30 torr. When the pressure was increased stepwise to 150 torr in an effort to increase the tungsten content at 1000° C., alloys ranging from 3 to 16% tungsten content were obtained, and microhardness data indicated a corresponding increase in tungsten content with increasing pressure.

Metallographic examination showed that the deposits thus obtained from the chlorinated Ta-10W alloy possessed a much finer and more homogeneous grain structure, resulting in better ductility and adhesion to the substrate, than deposits obtained in similar manner except that the Ta and W chlorides were produced by chlorinating tantalum and tungsten separately — cf. FIGS. 2 and 3.

TABLE I

| RUN NO. | SUMMARY OF EXTERIOR DEPOSITIONS | | | | | | |
|---|---|---|---|---|---|---|---|
| | 1 | 2 | 3 | 4 | 5 | 6 | 7 |
| Deposition Temp., °C | 1200 | 1100 | 1000 | 1000 | 1000 | 1000 | 950 |
| Chlorinator Temp., °C | 1000 | 1000 | 1000 | 1000 | 1000 | 1000 | 1000 |
| Pressure, Torr | 28–30 | 26–28 | 26 | 62–66 | 150 | 100 | 150 |
| $H_2$ flow, std, cc./min. | 2150 | 2150 | 2150 | 2150 | 2150 | 2150 | 2150 |
| $Cl_2$ flow, std, cc.min. | 1050 | 1050 | 1050 | 1050 | 1050 | 1050 | 1050 |
| Deposition time, min. | 45 | 45 | 45 | 60 | 60 | 90 | 90 |
| Plate thickness, in. | 0.015" | 0.012" | 0.011" | — | 0.007" | 0.012" | 0.005" |
| Microhardness, VHN | 245 | 185 | 150 | 160 | 500 | 235 | 250 |
| w/o W, via electron microprobe | 8.5 | 5.5 | 3 | 3 | 16 | 4.5 | 1.5 |

Depositions on Tube Bores

The foregoing procedure using Ta-10W alloy chips was employed to deposit Ta-W alloy coating on the bore surface of chromium plated tubes of 4130 steel 22 in (55.9) long and 0.3 in (7.62 mm) ID. The specimen holder 40 conducted the gaseous mixture through the tube bore which was chromium plated.

Tables 2 and 3 summarize the results of key deposition runs. The most profound effect on compositional uniformity was the hydrogen mixture ratio and temperature. A lowering of the hydrogen content resulted in decreases in the tantalum content of the deposit. Total gas flow (argon inert gas was used to vary and increase the gas velocity) and pressure had the predominant effect on coating thickness; low pressure was required to effect a high velocity, low residence time and minimal gas preheat. In this manner good uniformity between 0.002 in and 0.003 in. coating thickness was achievable on a 22 in long specimen.

Similar coatings possessing a fine, homogeneous grain structure were obtained when the foregoing procedure was utilized to produce Ta-W alloy coatings on the rifled bore surfaces of gun barrels 22 in (55.9 cm) long and 7.62 mm ID. One group of barrels was fabricated from Inconel 718 and another group was made from Vascojet MA steel.

TABLE 2

| RUN NO. | PARAMETER SUMMARY OF KEY INTERIOR TRIAL DEPOSITIONS (Substrate: 22" long × 0.3" I.D. 4130 Steel Tubes) | | | | | | | | | |
|---|---|---|---|---|---|---|---|---|---|---|
| | 2 | 3 | 4 | 5 | 6 | 9 | 11 | 24* | 35 | 50 |
| Deposition Temp., °C | 1040 | 1040 | 1000 | 1040 | 1040 | 1040 | 1040 | 1040 | 1040 | 1040 |
| Chlorination Temp., °C | 980 | 980 | 980 | 980 | 980 | 980 | 980 | 980 | 980 | 980 |
| Pressure, Torr | 36 | 36 | 36 | 36 | 28 | 36 | 36 | 36 | 20 | 20 |
| Ar flow, std. cc./min. | 400 | 500 | 500 | 530 | 500 | 500 | -0- | 500 | 500 | 500 |
| $H_2$ flow, std, cc./min. | 270 | 270 | 270 | 135 | 270 | 540 | 810 | 200 | 200 | 200 |
| $Cl_2$ flow, std. cc./min. | 135 | 135 | 135 | 135 | 135 | 135 | 135 | 135 | 135 | 135 |
| Deposition time, hr. | 3 | 3 | 3 | 3 | 3 | 3 | 3 | 2 | 1–½ | 2 |

*26" long specimen

TABLE 3

UNIFORMITY PROFILE SUMMARY OF KEY INTERIOR DEPOSITIONS (Substrate: 22" long × 0.3" I.D. 4130 steel tubes)

| RUN No. 2 Data Point | TEMPERATURE (C°) | PLATE THICKNESS (Mils) | HARDNESS (VHN)* | COMPOSITION (%W) |
|---|---|---|---|---|
| 1 | — | 3.5 | 570 | 30 |
| 2 | — | 8 | 350 | 11 |
| 3 | — | 4 | 350 | 8 |
| 4 | — | 4 | 290 | 5 |
| 5 | — | 4 | 260 | 3 |
| 6 | — | 2 | 550 | 5 |
| RUN NO. 3 | | | | |
| 1 | 900 | 8 | 480 | 24 |
| 2 | — | 7 | 340 | 13 |
| 3 | 1040 | 3 | 395 | 9 |
| 4 | 1040 | 2.5 | 350 | 6 |
| 5 | — | 3.5 | 270 | 5 |
| 6 | 1040 | 1.5 | 435 | 6 |
| RUN NO. 4 | | | | |
| 1 | 1000 | 1.5 | 1500 | 50 |
| 2 | — | 2.5 | 700 | 23 |
| 3 | 1000 | 3 | 700 | 12 |
| 4 | 995 | 2.5 | 500 | 6 |
| 5 | — | 2.5 | 340 | 7 |
| 6 | 1000 | 1.25 | 625 | 10 |
| RUN NO. 5 | | | | |
| 1 | 1045 | 2 | 1715 | 54 |
| 2 | — | 5 | 510 | 23 |
| 3 | — | 4.5 | 510 | 17 |
| 4 | 1045 | 2.5 | 390 | 14 |
| 5 | — | 2.5 | 560 | 11 |
| 6 | 1045 | 1.25 | 745 | 13 |
| RUN NO. 6 | | | | |
| 1 | 1045 | 1.5 | 1130 | 46 |
| 2 | — | 7 | 350 | 18 |
| 3 | — | 5.5 | 310 | 11 |
| 4 | 1045 | 4.5 | 310 | 8 |
| 5 | — | 4 | 290 | 6 |
| 6 | 1040 | 2 | 580 | 6 |

| RUN No. 9 Data Point | TEMPERATURE (C°) | PLATE THICKNESS (Mils) | HARDNESS (VHN)* | COMPOSITION (% W) |
|---|---|---|---|---|
| 1 | 1040 | 1.5 | 650 | 27 |
| 2 | — | 5.5 | 380 | 9 |
| 3 | 1040 | 4.5 | 315 | 5 |
| 4 | 1040 | 4.5 | 220 | 3 |
| 5 | — | 6.5 | 205 | 2 |
| 6 | 1040 | 3.5 | 340 | 2 |
| RUN NO. 11 | | | | |
| 1 | 1040 | 1 | 750 | — |
| 2 | — | 9.5 | 300 | 10 |
| 3 | 1040 | 5.5 | 225 | 4 |
| 4 | 1040 | 6.5 | 232 | 1 |
| 5 | — | 8 | 180 | 1 |
| 6 | 1040 | 2.5 | 320 | 11 |
| RUN NO. 24 | | | | |
| 1 | 1040 | 2.5 | 465 | 22 |
| 2 | — | 2 | 325 | 12 |
| 3 | 1040 | 1.5 | 350 | 9 |
| 4 | 1045 | 1.5 | 350 | 9 |
| 5 | — | 2 | 300 | 8 |
| 6 | 990 | 2 | 360 | 8 |
| 7 | — | 1.5 | 345 | 9 |
| RUN NO. 35 | | | | |
| 1 | 1040 | 1.5 | 860 | 53 |
| 2 | — | 2 | 390 | 25 |
| 3 | 1040 | 1.5 | 390 | 15 |
| 4 | 1040 | 1 | 415 | 12 |
| 5 | — | 1.5 | 425 | 10 |
| 6 | 965 | 2 | 175 | 7 |
| RUN NO. 50 | | | | |
| 1 | 1040 | 4.5 | 750 | 20 |
| 2 | — | 7 | 355 | 10 |
| 3 | 1040 | 3 | 355 | 10 |
| 4 | 1040 | 2.5 | 340 | 5 |
| 5 | — | 6 | 260 | 4 |
| 6 | 980 | 4 | 255 | 3 |

*Vickers Hardness Number

When an alloy of refractory metals is utilized as the starting material according to the present process, the conditions of chlorination of the alloy and reduction of the metal chlorides with hydrogen which can be employed are generally similar to those which can be employed when the constituent refractory metals are separately chlorinated prior to mixing and reduction of the metal chlorides with hydrogen, as in the prior art. The refractory metal chloride vapors can be mixed with a stream of inert carrier gas, such as argon and helium, to increase the gas velocity, etc., as is known in the art. When an alloy is used, it is obviously necessary to employ conditions sufficient to permit reaction of the least reactive metal constituent of the alloy so that all of the alloy metals are reacted. For example, as noted in the foregoing equations, the chlorination of the Ta-10W alloy is effected at 1000° C. since a temperature of 1000° C. is required for chlorinating tungsten although a temperature of 850° C., is sufficient for chlorinating tantalum. While a binary Ta-W alloy containing 10% by weight of tungsten is employed in the above examples, other ratios of tantalum to tungsten can be used. Also, by chlorinating a Ta-2.5W-0.15Nb alloy ("63 Metal", Manufactured by Fansteel Metallurgical Corp.) using a slightly (about 50° C.) lower chlorination temperature, deposits were obtained in the foregoing manner which possessed a fine grained structure similar to that produced from Ta-10W alloy but in the 1.5-2.5W range. Further, the present process can be advantageously utilized in similar manner with other alloys consisting essentially of two or more refractory metals selected from the group consisting of tantalum, tungsten, molybdenum and niobium, including binary and ternary alloys there of, e.g., Ta-Mo, W-Nb, Ta-Nb, Mo-W, W-Ta-Mo and Ta-W-Nb.

As is well known, the ratio of the metals, e.g., Ta/W, in the alloy deposit obtained by reduction of the mixed metal chlorides with hydrogen depends on the processing parameters, notably temperature, pressure, flow rate of the gases over the substrate, ratio of hydrogen to metal chlorides. For example, a lowering of the ratio of hydrogen to metal chlorides results in a decrease in the tantalum content of the alloy deposit obtained from a mixture of tantalum and tungsten chlorides, as shown in the foregoing examples.

The foregoing disclosure and drawings are merely illustrative of the principles of this invention and are not to be interpreted in a limiting sense. I wish it to be understood that I do not desire to be limited to the exact details of construction shown and described, because obvious modification will occur to a person skilled in the art.

I claim:

1. In a process of vapor depositing an alloy consisting essentially of refractory metals selected from the group consisting of tantalum, tungsten, molybdenum and niobium, on a substrate, wherein a coating of the alloy is deposited by reducing a mixture of the vapors of the refractory metal chlorides with hydrogen, the improvement which comprises generating the mixture of the vapors of the metal chlorides by contacting an alloy of the refractory metals with gaseous chlorine and reacting the resulting mixture of vapors with gaseous hydrogen.

2. A process according to claim 1, wherein the alloy consists essentially of tantalum and tungsten.

3. A process according to claim 1, wherein the substrate is a steel gun bore.

* * * * *